(12) United States Patent
Winer

(10) Patent No.: US 11,448,670 B2
(45) Date of Patent: Sep. 20, 2022

(54) OVERCURRENT DETECTION USING DISSIMILAR BIASING OF DIODE NETWORKS

(71) Applicant: Hamilton Sundstrand Corporation, Charlotte, NC (US)

(72) Inventor: Gordon Elliott Winer, Prescott, AZ (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 17/132,118

(22) Filed: Dec. 23, 2020

(65) Prior Publication Data

US 2022/0196709 A1    Jun. 23, 2022

(51) Int. Cl.
*H02H 3/08* (2006.01)
*H02H 9/02* (2006.01)
(Continued)

(52) U.S. Cl.
CPC ....... *G01R 19/16571* (2013.01); *B64D 27/02* (2013.01); *G01R 31/008* (2013.01);
(Continued)

(58) Field of Classification Search
CPC .............................. G01R 31/008; G01R 31/40; G01R 19/16571; H02H 3/08; H02H 1/0007
(Continued)

(56) References Cited

U.S. PATENT DOCUMENTS 3,931,580 A * 1/1976 Hebda ...................... H03K 5/01
                                                                 327/165
4,056,691 A * 11/1977 Freimanis ........... H04M 19/008
                                                                 379/379
(Continued)

FOREIGN PATENT DOCUMENTS

CN       104981068 A       10/2015
CN       204886383 U       12/2015
(Continued)

OTHER PUBLICATIONS

Extended European Search Report dated May 18, 2022, for corresponding European Application No. 21217153.2.

*Primary Examiner* — Jared Fureman
*Assistant Examiner* — Lucy M Thomas
(74) *Attorney, Agent, or Firm* — Kinney & Lange, P.A.

(57) ABSTRACT

Apparatus and associated methods relate to detection of an overcurrent condition by determining if a voltage across a current-sense resistor exceeds a predetermined voltage threshold. The voltage at each side of the current-sense resistor is sensed indirectly, through a diode network. The diode networks through which the voltages on each side of the current-sense resistor are biased differently from one another. Such differently-biased diode networks translate the voltages at each side of the current-sense resistor by different amounts, the biasing of these diode networks is such that a voltage difference between the second terminals of the first and second diode networks is of a first polarity during normal current conditions, and the voltage difference
(Continued)

between the second terminals of the first and second diode networks is of a second polarity during overcurrent conditions.

20 Claims, 5 Drawing Sheets

(51) Int. Cl.
    *G01R 19/165*     (2006.01)
    *B64D 27/02*     (2006.01)
    *G01R 31/00*     (2006.01)
    *G01R 31/40*     (2020.01)
    *H02H 1/00*     (2006.01)
    *B64D 27/24*     (2006.01)
    *B64D 41/00*     (2006.01)

(52) U.S. Cl.
    CPC ........... *G01R 31/40* (2013.01); *H02H 1/0007* (2013.01); *H02H 3/08* (2013.01); *B64D 27/24* (2013.01); *B64D 41/00* (2013.01)

(58) Field of Classification Search
    USPC ........................................................ 361/93.1
    See application file for complete search history.

(56) References Cited

U.S. PATENT DOCUMENTS

| | | | |
|---|---|---|---|
| 4,979,066 A * | 12/1990 | Kawata | H02J 13/00009 |
| | | | 361/18 |
| 5,640,293 A | 6/1997 | Dawes et al. | |
| 7,710,701 B1 | 5/2010 | Mei et al. | |
| 9,975,509 B2 * | 5/2018 | Schumacher | B60R 21/01 |
| 2001/0041478 A1 * | 11/2001 | Matsuura | H05B 39/047 |
| | | | 439/625 |
| 2004/0066594 A1 | 4/2004 | Gonthier et al. | |
| 2010/0085034 A1 | 4/2010 | Sakayori | |
| 2018/0088152 A1 * | 3/2018 | Wang | G01R 15/146 |
| 2018/0358801 A1 * | 12/2018 | Oms | G01R 19/0038 |

FOREIGN PATENT DOCUMENTS

| | | |
|---|---|---|
| CN | 109037809 A | 12/2018 |
| CN | 110361587 A | 10/2019 |
| DE | 102013213566 A1 | 1/2015 |

* cited by examiner

OVERCURRENT DETECTION USING DISSIMILAR BIASING OF DIODE NETWORKS

BACKGROUND

Some power supplies have a great capacity for supplying power, so much so that should a failure of a load manifest itself as an abnormally low impedance, the power supply could provide a dangerous level of current to the failing load. Such dangerously high current could cause further damage to the load, and perhaps even failure of the power supply or of other loads connected thereto. To avoid such additional damage or failure, overcurrent detection and protection circuitry can be employed. This overcurrent protection circuitry can have a significant temperature dependency, such that a trip current for the detection circuitry at low temperatures is quite different than the trip current for the detection circuitry at high temperatures. Such temperature variation can reduce the margin of safety for such overcurrent detection and protection circuitry.

SUMMARY

Apparatus and associated methods relate to a circuit for detecting an overcurrent condition in a load. The circuit includes a current-sense resistor, and first and second diode networks. The current-sense resistor has first and second terminals. The current-sense resistor is in series with the load. The current-sense resistor and the load are provided power by the power source. The first diode network has first and second terminals. The first terminal of the first diode network is connected to the first terminal of the current-sense resistor and the second terminal of the diode network conductively coupled to a first biasing circuit. The xecond diode network has first and second terminals. The first terminal of the second diode network is connected to the second terminal of the current-sense resistor and the second terminal of the diode network conductively coupled to a second biasing circuit. The first and second biasing circuits are configured to provide current to the first and second diode networks such that a voltage difference between the second terminals of the first and second diode networks is of a first polarity during normal current conditions, and the voltage difference between the second terminals of the first and second diode networks is of a second polarity during overcurrent conditions.

DETAILED DESCRIPTION

Apparatus and associated methods relate to detection of an overcurrent condition by determining if a voltage across a current-sense resistor exceeds a predetermined voltage threshold. The voltage at each side of the current-sense resistor is sensed indirectly, through a diode network. The diode networks through which the voltages on each side of the current-sense resistor are biased differently from one another. Such differently-biased diode networks translate the voltages at each side of the current-sense resistor by different amounts, the biasing of these diode networks is such that a voltage difference between the second terminals of the first and second diode networks is of a first polarity during normal current conditions, and the voltage difference between the second terminals of the first and second diode networks is of a second polarity during overcurrent conditions.

Figure 1:
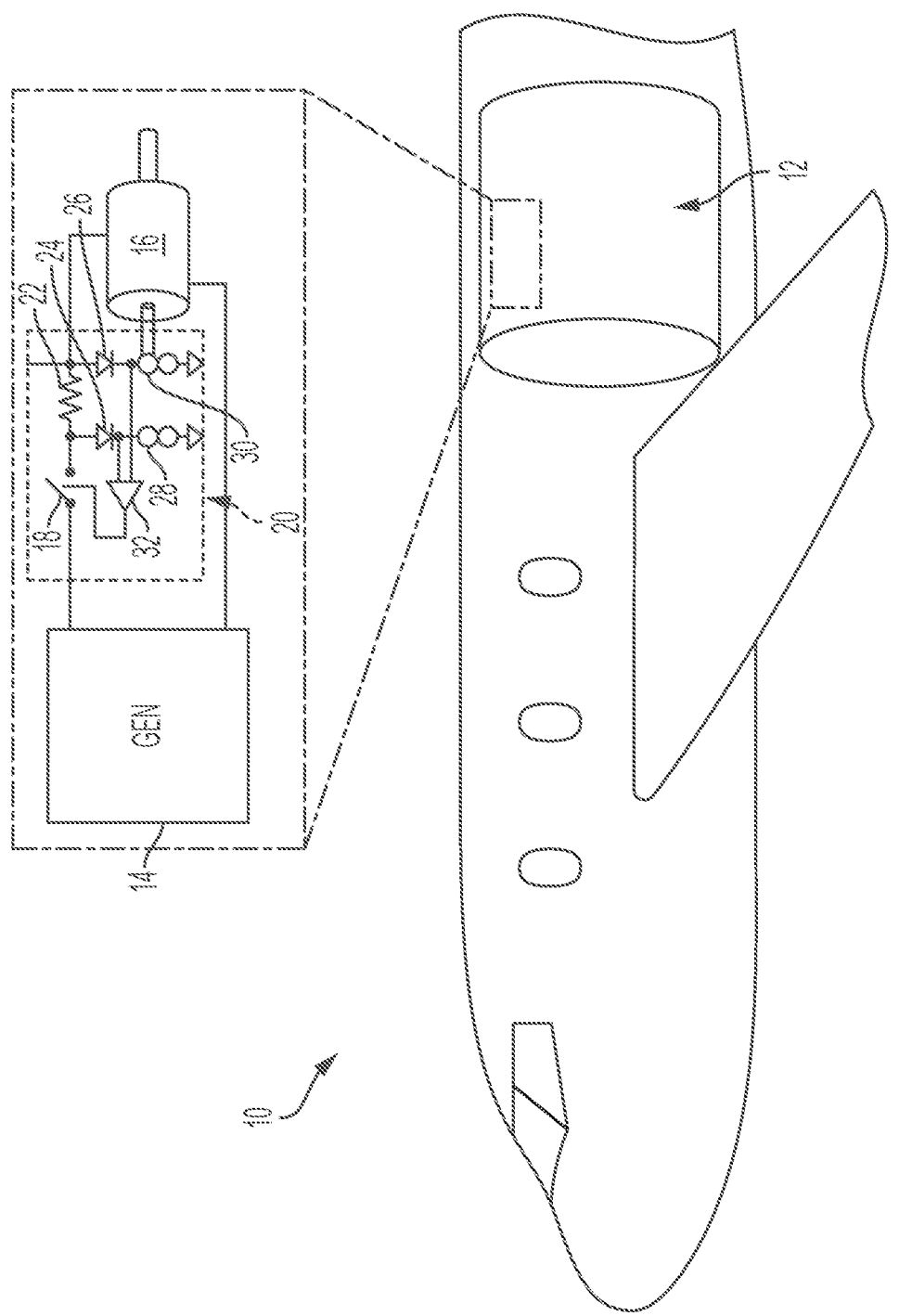
FIG. 1 is a schematic view of an overcurrent protection circuit monitoring current provided by an aircraft engine to an electric motor.

FIG. 1 is a schematic view of an overcurrent detection circuit monitoring current provided by an aircraft engine to an electric motor. In FIG. 1, aircraft 10 includes engine 12, electrical generator 14, electric motor 16, interrupt switch 18, and overcurrent protection circuit 20. Aircraft engine 12 acts as the prime mover for electric generator 14. Electric generator 14 generates electrical power for various electrical systems aboard aircraft 10, including electric motor 16. Electric motors and solenoids, such as electric motor 16, perform various mechanical operations on aircraft 10. Interrupt switch 18 is configured to controllably interrupt power provided to electric motor 16 by electric generator 14. Operation of interrupt switch 18 is performed by overcurrent protection circuit 20.

Overcurrent protection circuit 20 includes current-sensing resistor 22, first and second diode networks 24 and 26, first and second biasing circuits 28 and 30, and comparator 32. Current-sensing resistor 22 is in series with electric motor 16. In such a series configuration, current-sensing resistor 22 is configured to develop a voltage difference thereacross that is indicative of the current provided therethrough (and thus the current conducted by electric motor 16). The voltage difference across current-sensing resistor 22 is translated through first and second diode networks 24 and 26 to comparator 32.

First and second diode networks 24 and 26 are biased by first and second biasing circuits 28 and 30, respectively, thereby establishing biasing conditions for first and second biasing circuits 28 and 30. The biasing conditions established by first and second biasing circuits 28 and 30 for first and second diode networks 24 and 26, respectively, result in differential voltages across first and second diode networks 24 and 26 that are dissimilar one to another. For example, a first voltage difference across first diode network 24 might be greater than a second voltage across second diode network 26. This differential voltage difference $\Delta V$ between the voltage differences $V_1$ and $V_2$, established across first and second diode networks 24 and 26, respectively, is configured to be equal to a predetermined voltage threshold $V_{THRESHOLD}$:

$$\Delta V = V_1 - V_2 = V_{THRESHOLD} \qquad (1)$$

The threshold voltage is set to be equal to a sense voltage $V_{SENSE}$ across current-sensing resistor 22 that results from an overcurrent condition $I_{OVERCURRENT}$ flowing through current-sensing resistor 22. These biasing and current conditions result in the differential voltage at the inputs of comparator 32 being zero when the current flowing through current-sensing resistor 22 is equal to $I_{OVERCURRENT}$. Thus, the output signal of comparator 32 will be in a fist state when the current flowing through current-sensing resistor 22 is less than the overcurrent condition $I_{OVERCURRENT}$, and the output signal of comparator 32 will be in a second state when the current flowing through current-sensing resistor 22 is greater than the overcurrent condition $I_{OVERCURRENT}$. Such an output signal causes interrupt switch 18 to open during an overcurrent condition. In some embodiments, interrupt switch 18 will latch open in response to such an overcurrent condition.

Figure 2:
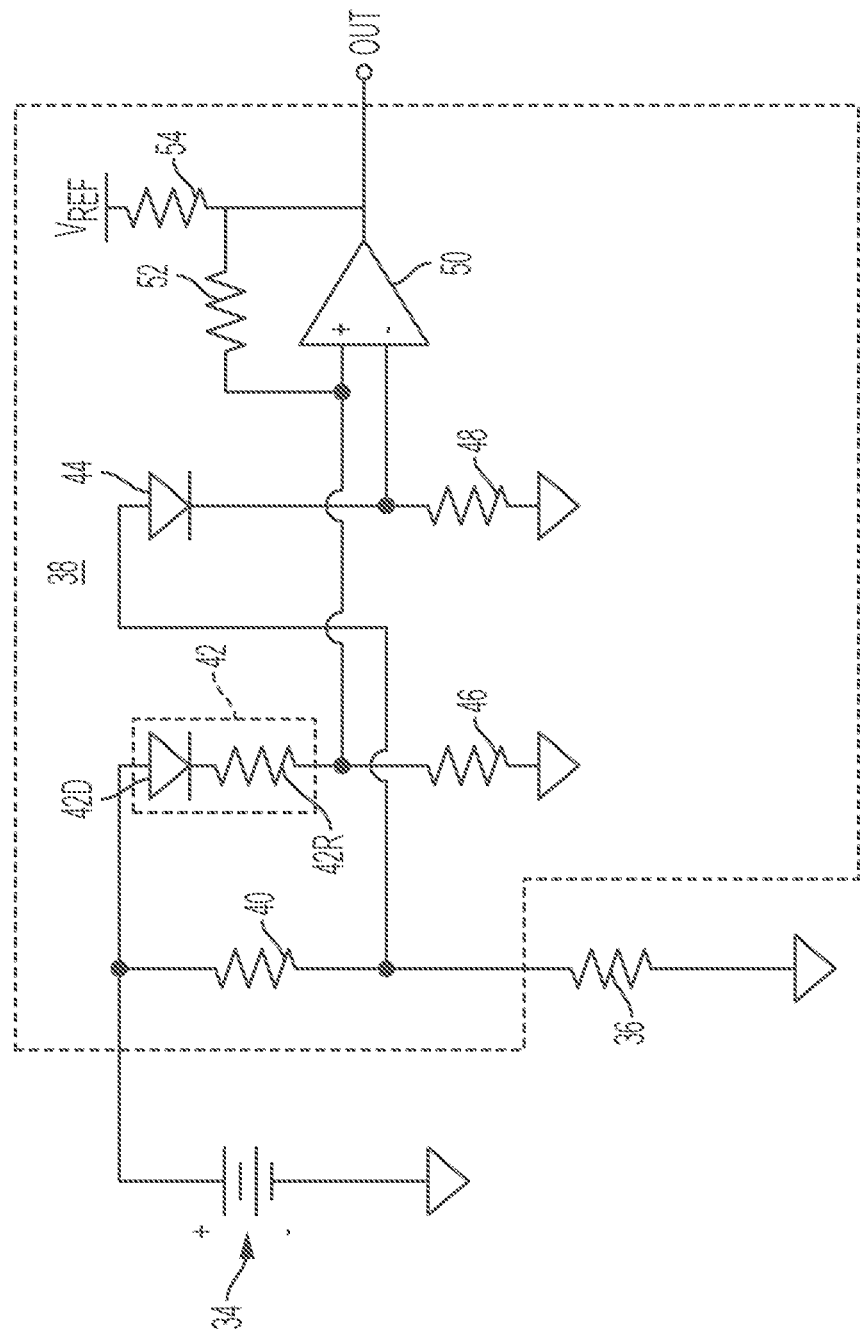
FIG. 2 is a schematic circuit drawing of an exemplary high-side overcurrent protection circuit, which uses dissimilar biasing of diode networks.

FIG. 2 is a schematic circuit drawing of an exemplary high-side overcurrent protection circuit, which uses dissimilar biasing of diode networks. In FIG. 2, electrical source 34 is providing power to load 36. The current provided by electrical source 34 to load 36 is monitored by high-side overcurrent protection circuit 38. Overcurrent protection circuit 38 includes current-sensing resistor 40, first and second diode networks 42 and 44, biasing circuits 46 and 48 comparator 50, feedback resistor 52 and output biasing resistor 54. Current-sensing resistor 40 is in series with and on the higher-voltage side of load 36, thereby designating overcurrent protection circuit 38 as being a high-side protection circuit.

First diode network 42 includes diode 42D and resistor 42R in series with one another. First biasing circuit 46 is simply a resistor in the depicted embodiment. In other embodiments first biasing circuit 46 could be another type of biasing circuit, such as, for example, a transistor current source. Second diode network 44 is simply a diode in the depicted embodiment. Second biasing circuit 48 is also simply a resistor in the depicted embodiment. In other embodiments second biasing circuit 48 could be another type of biasing circuit, such as, for example, a transistor current source.

To establish different biasing conditions for first and second diode networks 42 and 44, first and second diode networks are dissimilar to one another and/or first and second biasing circuits are dissimilar to one another. In the depicted embodiment, both are dissimilar to one another. A bias current determined by first biasing circuit 46 is one-tenth a bias current determined by second biasing circuit 48 in the depicted embodiment. Other ratios of resistance (and/or currents sourced thereby) can be used to establish different biasing conditions for first and second diode networks 42 and 44. For example, a ratio of currents sourced by first and second biasing circuits 46 and 48 can be 2:1, 3:1, 5:1, 8:1, 10:1, etc. In the depicted embodiment the diodes of first and second diode networks 42 and 44 are identical to one another. Although these diodes are identical to one another, voltage differences will be dissimilar across the diodes of first and second diode networks 42 and 44, because the current sourced by first and second biasing circuits 46 and 48 are dissimilar to one another.

In other embodiments, the currents sourced by first and second biasing circuits 46 and 48 can be substantially equal to one another, but first and second diode networks 42 and 44 then must be dissimilar to one another. For example, first diode network might have a single diode of a type, while second diode network might have 2, 3, 5, 8, 10, etc. of such type diodes in parallel. Such embodiments will also result in voltage differences being dissimilar across the diodes of first and second diode networks 42 and 44. In such embodiments, these voltage differences are because the diodes of first and second diode networks 42 and 44 are dissimilar to one another. This embodiment is not the preferred embodiment, in that current hogging by one of the parallel-connected diodes can result. Such current hogging can be exacerbated due to a negative temperature coefficient of forward barrier voltages of a diode.

The configuration of first and second diode networks 42 and 44, first and second biasing circuits 46 and 48, and current-sensing resistor 40 results in the voltages $V_{POS}$ and $V_{NEG}$ at the positive and negative inputs of comparator 50 as approximately (e.g., assuming resistor 52 is infinitely large and comparator 50 is ideal) given by:

$$V_{POS} = (V_{LOAD} + I_{LOAD}R_{SENSE} - V_{DN1})\left(\frac{R_{CS1}}{R_{CS1} + R_{DN1}}\right) \text{ and} \quad (2)$$

$$V_{NEG} = (V_{LOAD} - V_{DN2}). \quad (3)$$

where: $V_{LOAD}$ is the voltage across load 36; $I_{LOAD}$ is the current supplied by electrical source 34 via current-sensing resistor 40 to load 36; $R_{SENSE}$ is the resistance of current-sensing resistor 40; $V_{DN1}$ is the voltage across the diode 42D of first diode network 42; $V_{DN2}$ is the voltage across the diode of second diode network 44; $R_{CS1}$ is the resistance of first biasing circuit 46; and $R_{DN1}$ is the resistance of the resistor 42R of first diode network 42.

Such input voltages result in a voltage difference $\Delta V_{INPUT}$ between the positive and negative inputs of comparator 50 as given by:

$$\Delta V_{INPUT} = \quad (4)$$
$$(V_{LOAD} + I_{LOAD}R_{SENSE} - V_{DN1})\left(\frac{R_{CS1}}{R_{CS1} + R_{DN1}}\right) - (V_{LOAD} - V_{DN2}).$$

The output of comparator 50 will be of a first polarity or value in response to the voltage difference $\Delta V_{INPUT}$ between the positive and negative inputs of comparator 50 being positive, and the output of comparator 50 will be of a second polarity or value in response to the voltage difference $\Delta V_{INPUT}$ between the positive and negative inputs of comparator 50 being negative. Thus, a voltage difference $\Delta V_{INPUT}$ between the positive and negative inputs of comparator 50 of approximately zero volts is the switching voltage of comparator 50 (e.g., assuming resistor 52 has a resistance much greater than the resistance of resistor 42R and comparator 50 is nearly ideal). Solving equation (4) for $I_{SUPPLY}$ when $\Delta V_{INPUT}$ is zero volts results in the overcurrent threshold $I_{OVERCURRENT}$, at which the comparator switches output state:

$$I_{OVERCURRENT} = \quad (5)$$
$$\frac{1}{R_{SENSE}}\left[(V_{LOAD} - V_{DN2})\left(\frac{R_{CS1} + R_{DN1}}{R_{CS1}}\right) - (V_{LOAD} - V_{DN1})\right].$$

In the special case when no resistor is used in first diode network 42 (i.e., $R_{DN1}=0$), equation (5) reduces to:

$$I_{OVERCURRENT} = \frac{1}{R_{SENSE}}(V_{DN1} - V_{DN2}). \quad (6)$$

One purpose of including a resistor, such as resistor 42R, in first diode network 42 is to fine tune the overcurrent threshold $I_{OVERCURRENT}$. Such fine tuning can be better understood if equation (5) is rewritten as:

$$I_{OVERCURRENT} = \frac{1}{R_{SENSE}}\left[(V_{DN1} - V_{DN2}) + \frac{R_{DN1}}{R_{CS1}}(V_{LOAD} - V_{DN2})\right]. \quad (7)$$

Thus, the overcurrent threshold $I_{OVERCURRENT}$ is increased from that current threshold given by equation (6) by the amount given by:

$$\Delta I_{OVERCURRENT} = \frac{1}{R_{SENSE}} \left[ \frac{R_{DN1}}{R_{CS1}} (V_{LOAD} - V_{DN2}) \right]. \tag{8}$$

Finally, feedback resistor 52 and output biasing resistor 54 establish hysteresis so that the comparator does not chatter (i.e., oscillate) during a threshold crossing event.

Figure 3:
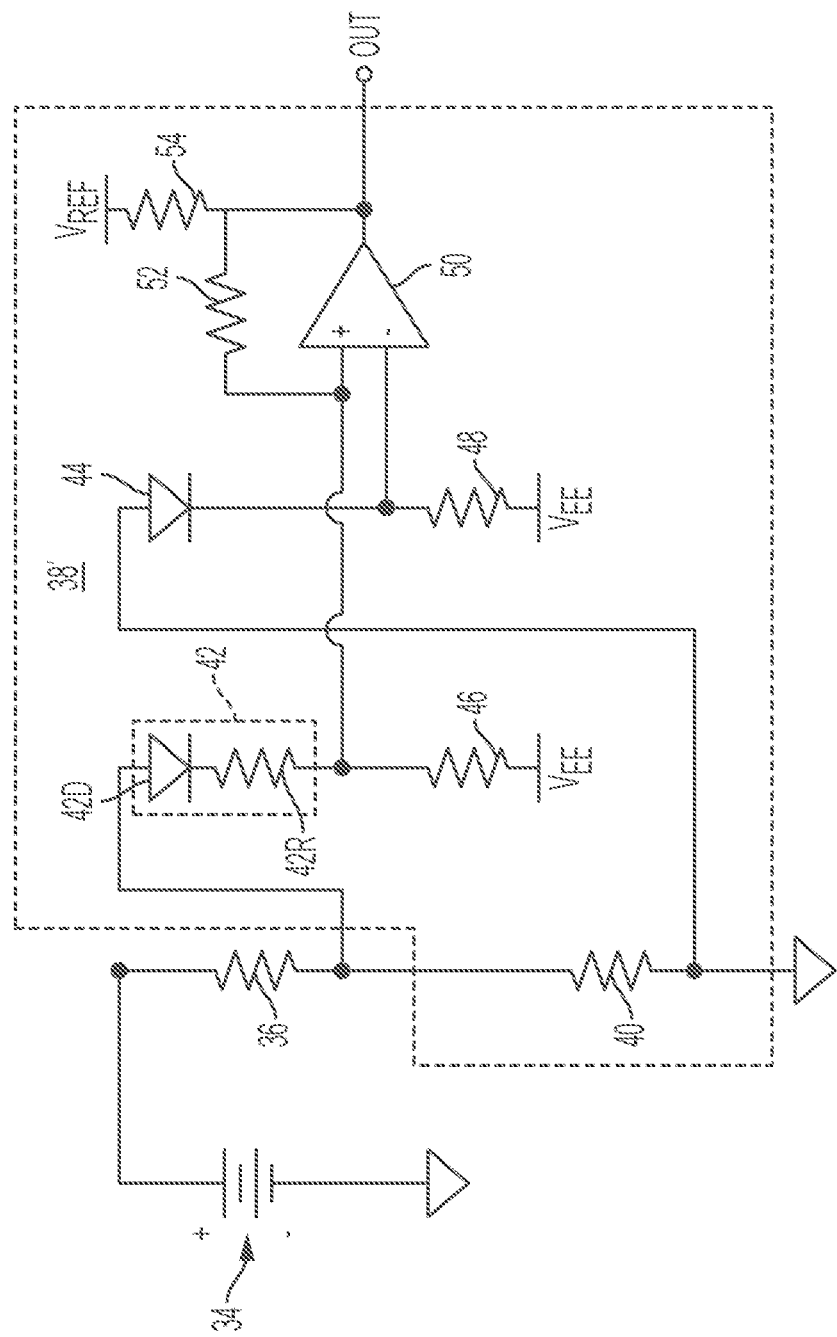
FIG. 3 is a schematic circuit drawing of an exemplary low-side overcurrent protection circuit, which uses dissimilar biasing of diode networks.

FIG. 3 is a schematic circuit drawing of an exemplary low-side overcurrent protection circuit, which uses dissimilar biasing of diode networks. In FIG. 3, electrical source 34 is providing power to load 36. The current provided by electrical source 34 to load 36 is monitored by low-side overcurrent protection circuit 38'. Overcurrent protection circuit 38' includes current-sensing resistor 40, first and second diode networks 42 and 44, biasing circuits 46 and 48 comparator 50, feedback resistor 52 and output biasing resistor 54. Current-sensing resistor 40 is in series with and on the lower-voltage side of load 36, thereby designating overcurrent protection circuit 38' as being a low-side protection circuit.

The FIG. 3 embodiment differs from the FIG. 2 embodiment in the relative ordering of load 36 and current-sensing resistor 40, as well as the biasing of biasing circuits 46 and 48. Operation of low-side overcurrent protection circuit 38', as depicted in FIG. 3, is nearly identical to operation of overcurrent protection circuit 38, as depicted in FIG. 2.

Figure 4:
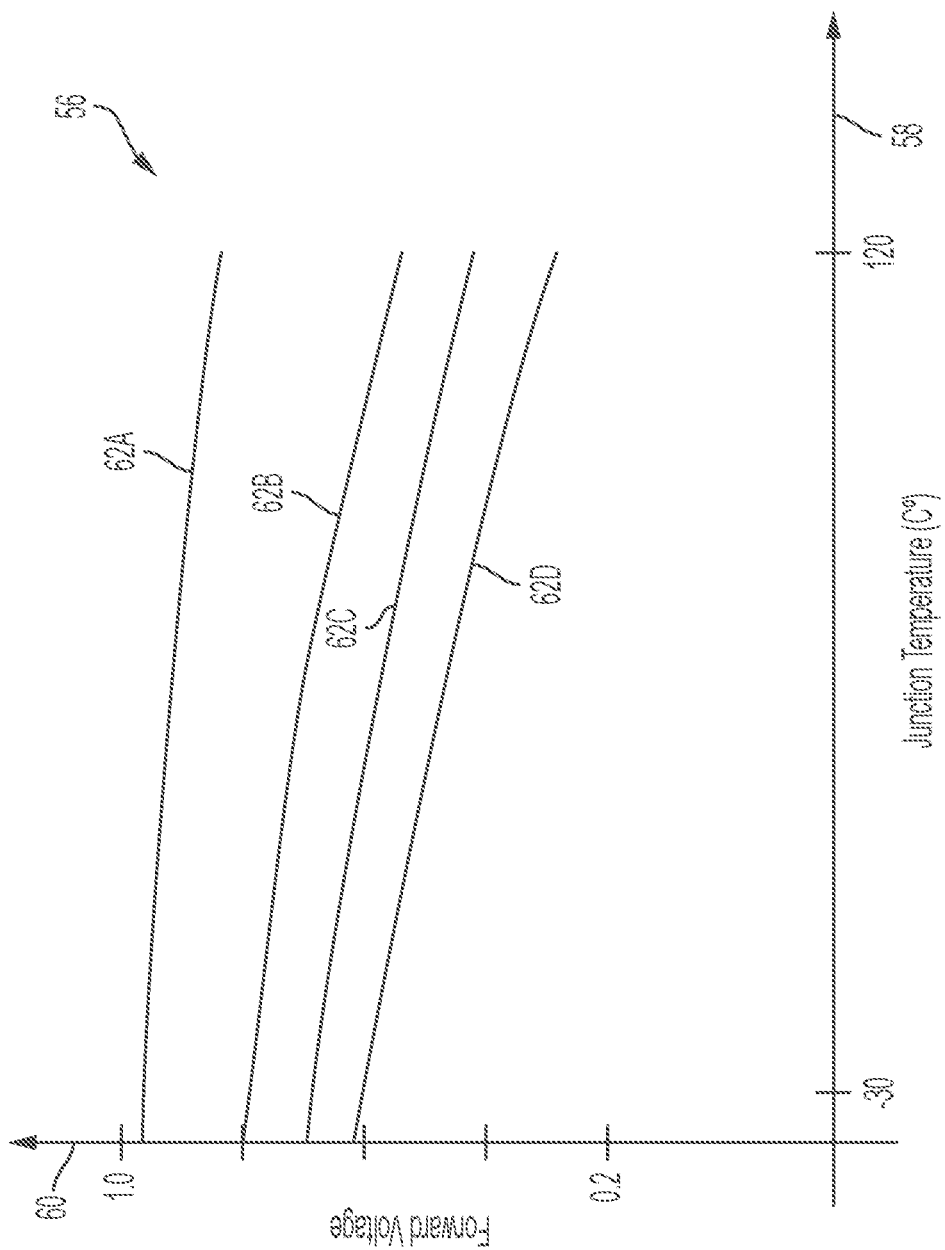
FIG. 4 is a graph depicting forward-voltage/temperature relations of a diode at various biasing condition.

FIG. 4 is a graph depicting forward-voltage/temperature relations of a diode at various biasing condition. In FIG. 4, graph 56 includes horizontal axis 58, vertical axis 60 and forward-voltage/temperature relations 62A-62D. Horizontal axis 58 is indicative of temperature, and vertical axis 60 is indicative of forward voltage across an exemplary diode, such as those that can be used in first and second diode networks of an overcurrent protection circuit. Relation 62A is indicative of a forward-voltage/temperature relation for the diode, when biased at 100 mA. Relation 62B is indicative of a forward-voltage/temperature relation for the diode, when biased at 10 mA. Relation 62C is indicative of a forward-voltage/temperature relation for the diode, when biased at 1 mA. And relation 62D is indicative of a forward-voltage/temperature relation for the diode, when biased at 100 µA.

Each of forward-voltage/temperature relations 62A-62D indicates a forward-voltage that decreases with increasing temperature. Although each of forward-voltage/temperature relations 62A-62D indicate a temperature dependent forward voltage, the temperature dependency of a voltage difference between adjacent pairs of forward voltage/temperature relations 62A-62D is much more modest. For example, the voltage difference between forward-voltage/temperature relation 62C and forward-voltage/temperature relation 62D is 95 mV at −30° C. and 131 mV at 120° C. Thus, the voltage difference between forward-voltage/temperature relations 62C and 62D only varies by 36 mV over a 150° C. temperature swing. This similarity of temperature dependencies for differently biased diodes is exploited in the overcurrent protection circuits 10, 38 and 38', as depicted in FIGS. 1-3. To exploit this similarity of temperature dependencies for differently biased diodes, such diodes are typically located nearby one another so that any temperature gradient that exists across an assembly results in close temperature matching of adjacent or nearby diodes.

Figure 5:
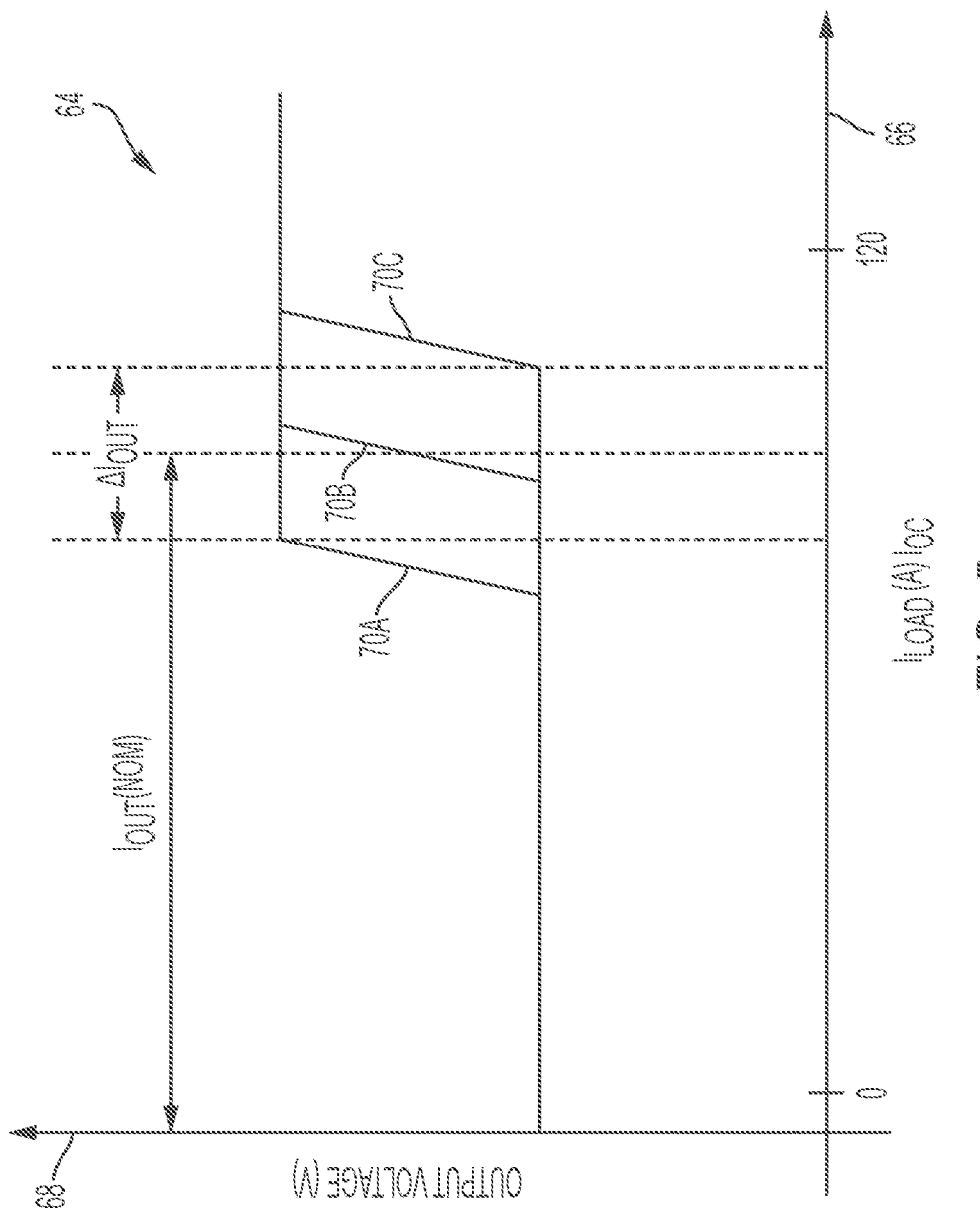
FIG. 5 is a graph depicting an output-detection-signal/current relations for the overcurrent protection circuit depicted in FIG. 2 at various temperatures.

FIG. 5 is a graph depicting an output-detection-signal/current relations for the overcurrent detection circuit depicted in FIG. 2 at various temperatures. In FIG. 5, graph 64 includes horizontal axis 66, vertical axis 68, and output-voltage/load-current relations 70A-70C. Horizontal axis 66 is indicative of load current $I_{LOAD}$, and vertical axis 68 is indicative of output voltage $V_{OUT}$. Relation 70A is indicative of an output-voltage of overcurrent protection circuit 38 (as depicted in FIG. 2) as a function of load current $I_{LOAD}$, when operating at a junction temperature of −55° C. Relation 70B is indicative of an output-voltage of overcurrent protection circuit 38 as a function of load current $I_{LOAD}$, when operating at a junction temperature of +25° C. Relation 70A is indicative of an output-voltage of overcurrent protection circuit 38 as a function of load current $I_{LOAD}$, when operating at a junction temperature of +100° C. A ratio of the delta load current $\Delta I_{LOAD}$ and the nominal load current $I_{LOAD}$(NOM) is low, at least in part due to the modest temperature dependency of the forward-voltage difference between differently biased diodes. In some embodiments this ratio of the delta load current $\Delta I_{LOAD}$ and the nominal load current $I_{LOAD}$(NOM) can be less than 12%, 10%, 7.5%, or 5%.

Discussion of Possible Embodiments

The following are non-exclusive descriptions of possible embodiments of the present invention.

Apparatus and associated methods relate to a circuit for detecting an overcurrent condition in a load. The circuit includes a current-sense resistor, and first and second diode networks. The current-sense resistor has first and second terminals. The current-sense resistor is in series with the load. The current-sense resistor and the load are provided power by the power source. The first diode network has first and second terminals. The first terminal of the first diode network is connected to the first terminal of the current-sense resistor and the second terminal of the diode network conductively coupled to a first biasing circuit. The xecond diode network has first and second terminals. The first terminal of the second diode network is connected to the second terminal of the current-sense resistor and the second terminal of the diode network conductively coupled to a second biasing circuit. The first and second biasing circuits are configured to provide current to the first and second diode networks such that a voltage difference between the second terminals of the first and second diode networks is of a first polarity during normal current conditions, and the voltage difference between the second terminals of the first and second diode networks is of a second polarity during overcurrent conditions.

The system of the preceding paragraph can optionally include, additionally and/or alternatively, any one or more of the following features, configurations and/or additional components:

A further embodiment of the foregoing system, wherein the first terminals of the first and second diode networks can be anode terminals of the first and second diode networks.

A further embodiment of any of the foregoing systems, wherein the first terminals of the first and second diode networks can be cathode terminals of the first and second diode networks.

A further embodiment of any of the foregoing systems, wherein at least one of the first and second diode networks can consist of a single diode.

A further embodiment of any of the foregoing systems, wherein at least one of the first and second diode networks can include a sensing diode in series with a sensing resistor.

A further embodiment of any of the foregoing systems, wherein the first and second diode networks can include diodes of a single type.

A further embodiment of any of the foregoing systems, wherein a ratio of currents sourced by the first and second biasing circuits can be greater than 8:1.

A further embodiment of any of the foregoing systems, wherein the first diode network can include a first number of parallel diode elements, and the second diode network can include a second number of parallel diode elements. The first number can be different from the second number.

A further embodiment of any of the foregoing systems, wherein a ratio of currents sourced by the first and second biasing circuits can be equal to one another.

A further embodiment of any of the foregoing systems, wherein the first terminal of the current-sense resistor can be connected to the power source and the second terminal of the current-sense resistor can be connected to the load, which is also connected to a voltage reference.

A further embodiment of any of the foregoing systems, wherein the first terminal of the current-sense resistor can be connected to the load, which is also connected to the power source, and the second terminal of the current-sense resistor can be connected to a voltage reference.

A further embodiment of any of the foregoing systems, wherein the first and second diode networks can be directly coupled to a corresponding one of the first and second biasing circuits.

A further embodiment of any of the foregoing systems can further include a comparator having positive and negative input terminals and an output terminal. The positive and negative input terminals can be conductively coupled to the second terminals of the first and second diode networks. The comparator can generate an output signal indicative of the overcurrent condition on the output terminal.

A further embodiment of any of the foregoing systems can further include a power-interrupt switch configured to interrupt power to the load in response to the output signal indicative of the overcurrent condition.

A further embodiment of any of the foregoing systems, wherein the positive and negative input terminals can be directly coupled to the second terminals of the first and second diode networks.

A further embodiment of any of the foregoing systems, wherein the power-interrupt switch can be latched open in response to the output signal indicative of the overcurrent condition.

A further embodiment of any of the foregoing systems, wherein each of the first and second biasing circuits can include a resistor.

A further embodiment of any of the foregoing systems, wherein each of the first and second biasing circuits can consist of a resistor.

A further embodiment of any of the foregoing systems, wherein a ratio of resistances of the resistors of the first and second biasing circuits can exceed 8:1.

A further embodiment of any of the foregoing systems, wherein the power source can be an aircraft's power source.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A circuit for detecting an overcurrent condition in a load, the circuit comprising:
   a current-sense resistor having first and second terminals, the current-sense resistor in series with the load, the current-sense resistor and the load provided power by a power source;
   a first diode network having first and second terminals, the first terminal of the first diode network connected to the first terminal of the current-sense resistor and the second terminal of the diode network conductively coupled to a first biasing circuit;
   a second diode network having first and second terminals, the first terminal of the second diode network connected to the second terminal of the current-sense resistor and the second terminal of the diode network conductively coupled to a second biasing circuit,
   wherein the first and second biasing circuits are configured to provide current to the first and second diode networks such that a voltage difference between the second terminals of the first and second diode networks is of a first polarity during normal current conditions of the load, and the voltage difference between the second terminals of the first and second diode networks is of a second polarity during overcurrent conditions of the load.

2. The circuit of claim 1, wherein the first terminals of the first and second diode networks are anode terminals of the first and second diode networks.

3. The circuit of claim 1, wherein the first terminals of the first and second diode networks are cathode terminals of the first and second diode networks.

4. The circuit of claim 1, wherein at least one of the first and second diode networks consists of a single diode.

5. The circuit of claim 4, wherein a ratio of currents sourced by the first and second biasing circuits is greater than 8:1.

6. The circuit of claim 1, wherein at least one of the first and second diode networks includes a sensing diode in series with a sensing resistor.

7. The circuit of claim 1, wherein the first and second diode networks comprise diodes of a single type.

8. The circuit of claim 7, wherein a ratio of currents sourced by the first and second biasing circuits are equal to one another.

9. The circuit of claim 1, wherein the first diode network comprises a first number of parallel diode elements, and the second diode network comprises a second number of parallel diode elements, wherein the first number is different from the second number.

10. The circuit of claim 1, wherein the first terminal of the current-sense resistor is connected to the power source and the second terminal of the current-sense resistor is connected to the load, which is also connected to a voltage reference.

11. The circuit of claim 1, wherein the first terminal of the current-sense resistor is connected to the load, which is also connected to the power source, and the second terminal of the current-sense resistor is connected to a voltage reference.

12. The circuit of claim 1, wherein the first and second diode networks are directly coupled to a corresponding one of the first and second biasing circuits.

13. The circuit of claim 12, further comprising:
a power-interrupt switch configured to interrupt power to the load in response to the output signal indicative of the overcurrent condition.

14. The circuit of claim 12, wherein the positive and negative input terminals are directly coupled to the second terminals of the first and second diode networks.

15. The circuit of claim 12, wherein the power-interrupt switch latches open in response to the output signal indicative of the overcurrent condition.

16. The circuit of claim 15, wherein a ratio of resistances of the resistors of the first and second biasing circuits exceeds 8:1.

17. The circuit of claim 1, further comprising:
a comparator having positive and negative input terminals and an output terminal, the positive and negative input terminals conductively coupled to the second terminals of the first and second diode networks, the comparator generating an output signal indicative of the overcurrent condition on the output terminal.

18. The circuit of claim 1, wherein each of the first and second biasing circuits comprise a resistor.

19. The circuit of claim 1, wherein each of the first and second biasing circuits consist of a resistor.

20. The circuit of claim 1, wherein the power source is an aircraft's power source.

\* \* \* \* \*